(12) United States Patent
Ochi et al.

(10) Patent No.: US 7,645,932 B2
(45) Date of Patent: Jan. 12, 2010

(54) SOLAR CELL DEVICE HAVING A CHARGE PUMP

(75) Inventors: Sam Ochi, Saratoga, CA (US); Nathan Zommer, Los Altos, CA (US)

(73) Assignee: IXYS Corporation, Santa Clara, CA (US)

( * ) Notice: Subject to any disclaimer, the term of this patent is extended or adjusted under 35 U.S.C. 154(b) by 715 days.

(21) Appl. No.: 10/936,780

(22) Filed: Sep. 7, 2004

(65) Prior Publication Data

US 2005/0061361 A1    Mar. 24, 2005

Related U.S. Application Data

(60) Provisional application No. 60/501,962, filed on Sep. 10, 2003.

(51) Int. Cl.
*H01L 31/00* (2006.01)
*G05F 3/02* (2006.01)

(52) U.S. Cl. .................. 136/252; 136/293; 327/536; 327/537

(58) Field of Classification Search ............ 136/293, 136/252; 327/536–537
See application file for complete search history.

(56) References Cited

U.S. PATENT DOCUMENTS

| 4,121,115 | A | * | 10/1978 | de Mere ............... 307/150 |
| 4,523,217 | A | * | 6/1985 | Jibu .................. 327/514 |
| 5,781,473 | A | * | 7/1998 | Javanifard et al. ...... 365/185.18 |
| 5,944,913 | A | * | 8/1999 | Hou et al. ............. 136/255 |
| 6,847,834 | B1 | * | 1/2005 | Leem ................. 455/572 |
| 2002/0060333 | A1 | * | 5/2002 | Tanaka et al. ........... 257/299 |
| 2002/0093854 | A1 | * | 7/2002 | Liu ................... 365/189.11 |

FOREIGN PATENT DOCUMENTS

WO    WO0165711 A1 *    7/2001

* cited by examiner

*Primary Examiner*—Nam X Nguyen
*Assistant Examiner*—Dustin Q Dam
(74) *Attorney, Agent, or Firm*—Townsend and Townsend and Crew LLP

(57) ABSTRACT

A solar cell device includes a solar cell section configured to output a first voltage upon receiving light. A charge pump circuit includes a first charge pump. The first charge pump includes a first terminal and a second terminal. The first terminal is configured to receive the first voltage from the solar cell section, and the second terminal is configured to output a second voltage that is higher than the first voltage. An output section is configured to receive an output voltage output by the charge pump circuit. The charge pump circuit is formed on a single semiconductor substrate.

15 Claims, 3 Drawing Sheets

SOLAR CELL DEVICE HAVING A CHARGE PUMP

CROSS-REFERENCES TO RELATED APPLICATIONS

The present application claims priority to U.S. Provisional Patent Application No. 60/501,962, filed on Sep. 10, 2003, which is incorporated by reference.

BACKGROUND OF THE INVENTION

The present invention relates to a charge pump circuit for low voltage source, more particularly to a charge pump circuit for use with one or more photovoltaic solar cells.

Photovoltaic solar cells (PVSC) includes a thin, single crystal semiconductor substrate that has a p-n junction. Photo-electric excitation occurs within the bulk of the semiconductor when exposed to incident electromagnetic radiation, i.e., light. The excitation generates electron-hole pairs. The minority carriers, i.e., electrons in the p-type region and holes in the n-type region, migrate towards and across the p-n junction, thereby creating: a potential difference across the p-n junction, from which electric power may be obtained by appropriately placing electrodes.

A single PVSC or solar cell generally produces a low DC voltage, e.g., less than 1 v, when exposed to light. That is, the solar cells made of silicon generates about 0.65 volt each, and the solar cells made of GaAs generates about 1 volt. However, most electrical circuits require more than 1 volt to operate, e.g., 3 volts or more or 5 volts or more. Also the voltage needed to charge batteries to energy storage requires 1.2 volts or more or 3.9 volts or more.

Therefore, a module having a plurality of solar cells is used to operate the electrical circuits or charge batteries. The solar cells in the module are connected in series to increase the voltage output. For example ten solar cells may be connected in series to produce an output of about 6.5 volts. The solar cells may also be connected in parallel to increase the current output. Many solar cell modules have solar cells arranged in a matrix to increase both the voltage and current outputs. That is, the modules have rows and columns of solar cells connected in series and parallel.

Such a module is made by "off chip" rewiring in external assembly method that increases the cost of a photovoltaic (PV) module. This type of assembly is performed in emerging economies which have relatively low wages. In addition, care must be taken in selecting the suitable cells for connecting them in series. If one cell is defective, or has a lower efficiency, it becomes the "weakest link in the chain".

Alternatively, the solar cells may be connected monolithically in a single chip by manufacturing the chip using a Silicon On Insulator (SOI) technology. In this technology, each solar cell diode is isolated electrically from each other and then connected by a suitable metal layer during the semiconductor device fabrication process. However, the SOI technology is considerably more complicated and expensive than the conventional semiconductor process technology for producing a plurality of independent cells. The SOI technology is also more likely to produce defective chips, thereby lowering the yield.

BRIEF SUMMARY OF THE INVENTION

Embodiments of the present invention relates to a charge pump circuit for use in a solar cell system. The charge pump circuit is provided between the PVSC and the battery or capacitor to boost the voltage output by the PVSC to a suitable voltage level, e.g., 1.2 volt or more, 3 volts or more, 3.9 volts or more, or 5 volts or more. The charge pump serves a dual function of providing voltage gain and switching function to prevent battery or capacitor discharge to the PVSC under a low-light condition, where the battery voltage is higher than the output voltage of the PVSC. In one embodiment, the charge pump circuit is provided with the lowest possible number of terminals, e.g., three terminals. The charge pump circuit derives all its power internally from the PVSC without being supplied with external power supply.

In one embodiment, the solar cell system has a single PVSC on a single chip. The single PVSC outputs about 1 volt or less. The charge pump may be readily modified to a variety of desired output voltages based on the specific application. The pump may be modified to start delivering energy at a specified light level on the PVSC for best efficiency. The present embodiment provides a low cost a solar cell system since a single PVSC chip is used to charge to a battery.

The single PVSC and the charge pump is scalable to provide higher current output by connecting them in parallel with one or more modules having a single PVSC and charge pump. A solar cell system having parallel modules may also be used in such a way that if a PVSC in one module does not receive sufficient light to deliver energy efficiently, its charge pump IC is electrically cut off from the circuit and allow other PVSCs that have better lighting to deliver the charge to the battery. Such a configuration may be referred to as an OR-ing" arrangement.

In one embodiment, a solar cell device includes a solar cell section configured to output a first voltage upon receiving light. A charge pump circuit includes a first charge pump. The first charge pump includes a first terminal and a second terminal and is configured to be powered by the solar cell section. The first terminal is configured to receive the first voltage from the solar cell section, and the second terminal is configured to output a second voltage that is higher than the first voltage. An output section is configured to receive an output voltage output by the charge pump circuit. The charge pump circuit is formed on a single semiconductor substrate. The solar cell device and the charge pump circuit are formed in the same semiconductor substrate. The solar cell device further includes an auxiliary solar cell section coupled to the charge pump circuit to provide a bias voltage to turn on the charge pump circuit. The via voltage is higher than the first voltage output by the solar cell section. The auxiliary solar cell section is formed on a single semiconductor substrate. The auxiliary solar cell section includes a plurality of solar cells connected in series. The auxiliary solar cell section is formed on a single semiconductor substrate and includes a plurality of solar cells connected in series.

In another embodiment, a charge pump circuit for use in a solar cell device includes a first charge pump including a first terminal and a second terminal, the first terminal being configured to receive a first voltage from one or more solar cells, the second terminal configured to output a second voltage that is greater than the first voltage, the first charge pump being powered by one or more solar cells; and a second charge pump including a third terminal and a fourth terminal, the third terminal being coupled to the second terminal of the first charge pump to receive the second voltage, the second charge pump being configured to output a third voltage via the fourth terminal using the second voltage as a first bias voltage, the third voltage being greater than the second voltage.

In another embodiment, a solar cell device includes a solar cell section configured to output a first voltage upon receiving light; a charge pump circuit including a first charge pump, the first charge pump including a first terminal and a second terminal, the first terminal being configured to receive the first voltage from the solar cell section and the second terminal being configured to output a second voltage that is higher than the first voltage; an auxiliary solar cell section configured to provide a bias voltage to the charge pump circuit, the auxiliary solar cell section including a plurality of solar cells connected in series; and an output section configured to receive an output voltage output by the charge pump circuit.

In yet another embodiment, a method for operating a solar cell device includes receiving a first voltage from a solar cell section at a first terminal; increasing the first voltage to a second voltage that is greater than the first voltage using a charge pump; and outputting an output voltage that has been increased to a voltage suitable for use in a load coupled to the solar cell section.

DETAILED DESCRIPTION OF THE INVENTION

Figure 1A:
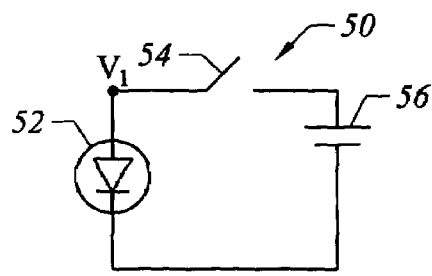
FIG. 1A illustrates a PVSC or solar cell system including a solar cell circuit, a switch, and a charging capacitor.
Figure 1B:
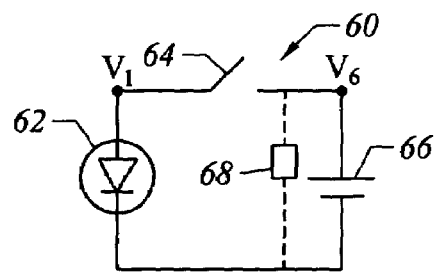
FIG. 1B illustrates a PVSC system including a solar cell circuit, a switch, and a battery.

FIG. 1A illustrates a PVSC or solar cell system 50 including a solar cell circuit 52, a switch 54, and a charging capacitor 56. The switch is a diode, MOSFET switch, relay, or the like. FIG. 1B illustrates a PVSC system 60 including a solar cell circuit 62, a switch 64, and a battery 56. The system 50 and 60 are substantially similar to each other. Accordingly, the discussion below is based using the system having a diode switch and batteries for illustrative convenience. The same basic principles applies to a capacitor charged system or a combination of a capacitor and battery system.

The system 60 having a diode as the switch 64 connected in series to the solar cell is a relatively simple design. The output voltage $V_1$ of the solar cell 62 needs to be higher than the voltage $V_b$ of the battery 66 to charge the battery. If a single solar cell or PVSC delivers about 0.65 volt of output, the diode switch 64 needs to have a forward voltage drop of less than 0.65 volt to be turned on. A standard bipolar diode cannot be used since it requires about 0.7 volt to turn it on.

A Schottkey diode may be used. However, it has a forward voltage drop of about 0.25 volt. This is a voltage loss of about 38 percent of the total voltage (0.65 volt) generated by a single PVSC. The battery, accordingly, would be charged using the remaining 0.4 volt, which is too low to operate most known electrical circuits.

To minimize the voltage loss, a switch having a very low on-resistance may be used, e.g., a MOSFET synchronous rectifier or a relay. However the use of such a MOSFET or relay requires complex circuits to drive the MOSFET or the relay, which adds to the cost and might require an extra DC voltage source to turn on the MOSFET or the relay.

In addition, the system 60 with a single PVSC cell is capable of producing only about 0.7 volt of output. Therefore, the battery could be charged to only 0.7 volt even if no voltage loss occurs across the switch, which would still be too low to operate most electrical circuits.

One solution to the low voltage problem is to connect a DC to DC converter between the PVSC and the battery to boost the voltage of the PVSC to a suitable voltage value, e.g., 3.3 volts. This approach may be feasible in certain applications, especially in high power systems with numerous solar cells arranged in a matrix. The power generated by such system may be used to power the DC to DC converter. However, such an approach would not be practical for relatively low power systems. In addition, a typical DC to DC converter includes an inductor, which may not be easily integrated into a single integrated circuit or semiconductor chip.

Accordingly, a charge pump circuit that relies on switches and capacitors that can be integrated in an IC form on a single chip would be desirable. However, the required minimal operational voltage for a charge pump is generally higher than the 0.65 volt output by a single PVSC.

Figure 2:
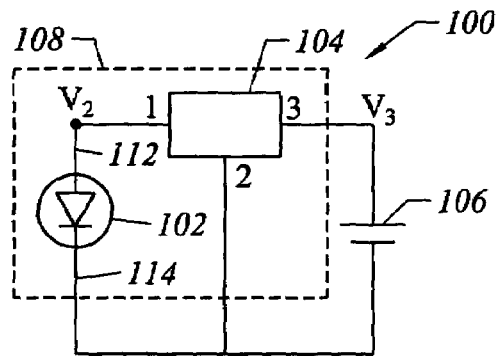
FIG. 2 illustrates a solar cell system including a PVSC device, a charge pump circuit, and a battery according to one embodiment of the present invention.

FIG. 2 illustrates a solar cell system 100 including a PVSC device 102, a charge pump circuit 104, and a battery 106. In one embodiment, the charge pump circuit 104 is provided in one semiconductor chip, and the PVSC device is provided in another chip. Together they comprise a solar cell module 108. Alternatively, the pump circuit 104 and the PVSC device (also referred to as "PVSC") 102 may be formed on a single chip.

The PVSC 102 is provided between nodes 112 and 114. In the present embodiment, the PVSC 102 is a single solar cell provided on a semiconductor substrate. However, the PVSC 102 may include a plurality of solar cells connected in series or parallel or both. These plurality of solar cells may be provided on a single semiconductor substrate (e.g., on SOI or on a plurality of semiconductor substrates.

The charge pump circuit has three terminals 1, 2, and 3. The first terminal 1 is coupled to the PVSC 102 via the node 112, and the second terminal 2 is coupled to the node 114, and the third terminal is coupled to the battery 106. The charge pump circuit receives an output voltage $V_2$ of the PVSC 102, e.g., 0.65 volt for a single solar cell, and boost it to a voltage $V_3$ that is suitable for charging the battery 106. The charge pump circuit is powered by the energy supplied by the PVSC 102 and does not require an external power source according to one embodiment of the present invention.

The solar cell system 100 has a single PVSC 102 in the present embodiment for more efficient use of the PVSC. Generally the power generated by the PVSC corresponds to the surface area available to receive light (or "effective light-receiving area"). The effective light receiving area for a PVSC is a total surface area minus a surface area of metal interconnects and other unusable areas (e.g., scribe regions). For illustrative simplicity, the surface area of metal interconnect is used to represent all unusable areas in the PVSC.

Figure 3A:
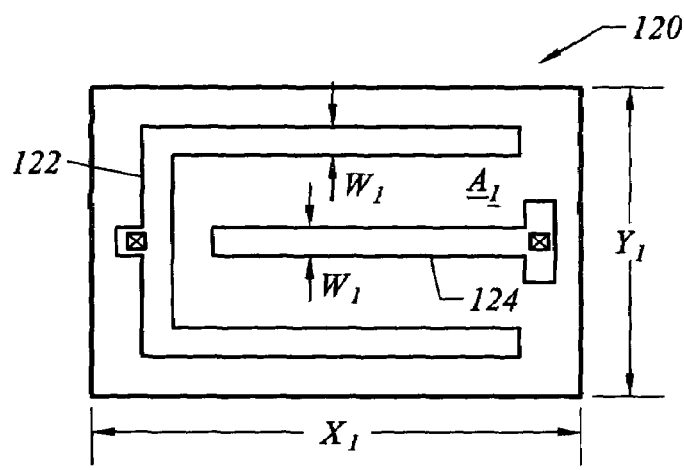
FIG. 3A illustrates a top view of a single solar cell having a first or positive electrode and a second or negative electrode.

FIG. 3A illustrates a top view of a single solar cell 120 having a first or positive electrode 122 and a second or negative electrode 124. An effective light-receiving area $A_1$ of the PVSC 120 is defined by the total surface area minus the surface areas of the first and second electrodes 122 and 124. The total surface area is defined by ($X_1$ $Y_1$). The electrodes 122 and 124 have a width $W_1$ according to the processing technology used.

Figure 3B:
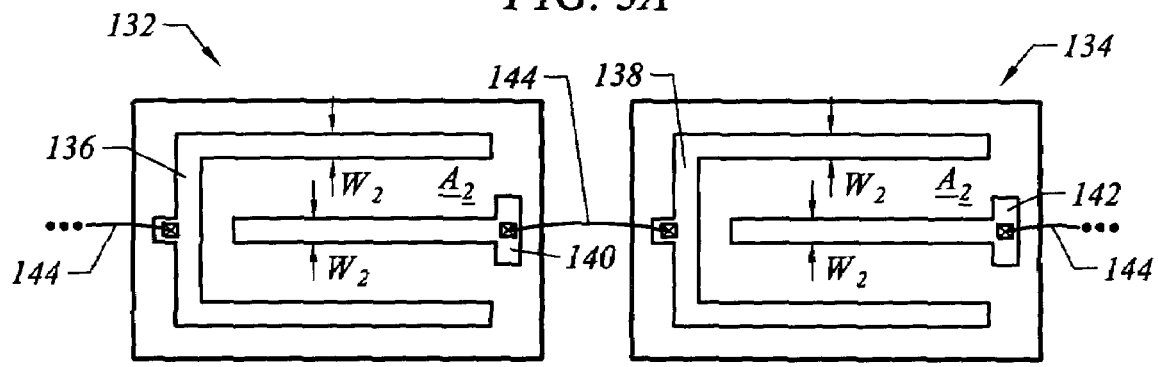
FIG. 3B illustrates a top view of a plurality of solar cells connected in series to provided a higher output voltage.

FIG. 3B illustrates a top view of a plurality of solar cells 132 and 134 connected in series to provided a higher output voltage. The solar cells 132 and 134 have positive electrodes 136 and 138 and negative electrodes 140 and 142. The positive and negative electrodes are coupled to each other by wires 144. The electrodes 136-142 have a width $W_2$ according to a processing technology used, which would be the same processing technology as that used for the PVSC 120. Accordingly, $W_1$ and $W_2$ would be the same.

If the total surface area of the solar cells 132 and 134 is the same as that of the single solar cell 120, an effective light-receiving area $A_2$ for the former is less than the effective area $A_1$ of the former since the electrodes 136-142 occupy a greater percentage of the total surface area of the solar cells 132 and 134 than the percentage of the total area ($X_1$ $Y_1$) occupied by the electrodes 122 and 134 of the single solar cell 120. Therefore, more energy can be generated for a given area of semiconductor if a less number of solar cells is used for the system 100. In addition, the cost of wiring the solar cells may also be avoided, which would provide a significant cost saving.

However, it has been difficult to implement a solar system having only a single PVSC since it generates about 1 volt or less, as explained above. Generally, a conventional PVSC device includes 10 or more cells provided in series to increase the voltage output to about 6 volts or more.

The present inventors have discovered that such an obstacle may be overcome by providing the charge pump circuit 104 of FIG. 2. Such a charge pump enables uses of a reduced number of solar cells, e.g., a single solar cell, for the system 100. In one embodiment, the system 100 or the PVSC 102 has no more than 10 cells, or no more than 8 cells, or no more than 7, or no more than 5, no more than 3 cells, or no more than 2 cells.

Figure 4:
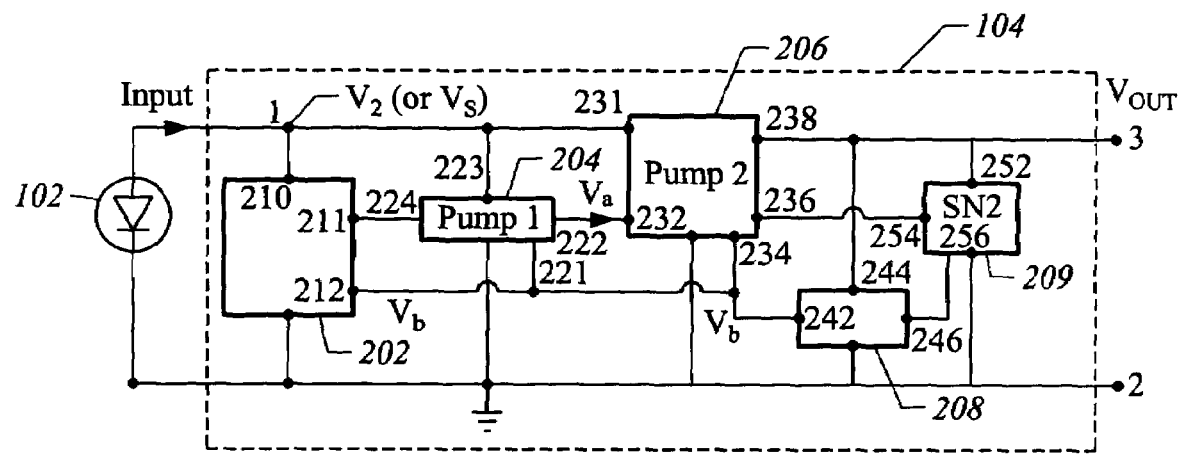
FIG. 4 illustrates a detailed view of the charge pump circuit of the solar cell system according to one embodiment of the present invention.

FIG. 4 illustrates a detailed view of the charge pump circuit 104 of the solar cell system 100 according to one embodiment of the present invention. The pump circuit 104 is powered by the solar cell itself. Accordingly, the pump is a low power integrated circuit (IC), which is preferably designed with low power CMOS technology. The majority of the circuit is preferably configured to operate in a "sub-threshold" range of operation and optimized for low voltage operation. In one embodiment, the pump circuit 104 is configured to operate as soon as the PVSC 102 generates an output voltage of about 0.5 volt or greater. In the present implementation, the pump circuit 104 is not connected to any external power source and is powered solely by the solar cell.

The pump circuit 104 includes an input section 202, a first charge pump 204, a second charge pump 206, an auxiliary component 208, and a sense component 209. The pumps are provided in a cascading arrangement, where the first charge pump is a minor charge pump and the second charge pump is the primary charge pump. The input section includes terminals 210-212. The first pump 204 includes terminals 221-224. The second pump 206 includes terminals 231-238. The auxiliary component 208 includes terminals 242-246. The sense component 209 includes terminals 252-256. In one embodiment, the pump circuit 104 includes three or more charge pumps in order to sequentially increase the voltages from $V_1$ to $V_{out}$.

The terminal 1 of the pump circuit 104 is coupled to the terminals 210 of the input section, the terminal 223 of the first pump 204, and the terminal 231 of the second pump 206. The terminal 3 (or output of the pump circuit) is connected to the terminal 238 of the second pump, the terminal 252 of the sense component 209, and the terminal 244 of the auxiliary component 208. The input section 202 and the first pump 204 are connected via the terminals 211 and 244. The first pump 204 and the second pump 206 are connected via the terminals 222 and 232. The second pump 206 and the auxiliary component 208 are coupled via the terminals 234 and 242 and terminals 238 and 244. The second pump 206 and the sense component 209 are connected via the terminals 236 and 254. The auxiliary component 208 and the sense component 209 are connected to each other via the terminals 246 and 256.

The input section 202 is provided to sense the output voltage $V_2$ of the PVSC 102 and enables the first charge pump 204 to boost the voltage $V_2$ to a higher voltage $V_a$. The voltage $V_a$ then serves as the supply voltage to turn on the second charge pump 206. The second charge pump 206 outputs a voltage $V_3$ that is suitable to charge the battery 106.

The arrangement of cascading charge pumps above facilitates efficient operation of the circuit 104 under low voltage bias conditions. This arrangement allows the main voltage boosting stage, i.e., the second pump 206, to operate with a higher voltage bias ($V_a$) with lower conduction losses in the switches. Furthermore, this cascading arrangement also allows for lower noise soft start operation, which minimizes the input capacitance required for the input circuit facing the PVSC.

Another benefit of this cascading approach is that it provides better isolation in the reverse direction between the output and input of the pump circuit 104, i.e., better isolation between terminals 3 and 1, thereby reducing the leakage current from the battery 106 to the PVSC 102. The separated charge pumps 204 and 206 may be designed to operate in different frequencies and phases from each other to reduce peak current flows in the conductor lines in the pump circuit 104, thereby reducing the noise, switching losses, conduction losses and backward leakage from the output to input of the pump circuit.

The input section 202 is designed mainly with sub-threshold CMOS technology and is self powered and self started as soon as the voltage output of the PVSC reaches a predetermined level $V_s$, where $V_s$ is less than or equal to $V_2$. The sensing point for the voltage $V_s$ is the terminal 1, which is connected to the terminal 210 of the input section.

In operation, the input section activates the charge pump 204. The pump 204 increases the voltage $V_2$ received from the terminal 1 to the $V_a$. In one embodiment, the pump 204 is a doubling pump and provides a voltage gain of 100%, i.e., $2V_2=V_a$. The voltage $V_a$ output by the pump 204 is applied as the bias voltage to the main charge pump 206.

The pump 206 receiving the bias voltage $V_a$ operates more efficiently than if the voltage $V_2$ had been received directed from the terminal 1 or the output of the PVSC 102. That is, the pump 206 operates in a full enhancement mode or close thereto with the bias voltage $V_a$ rather than in a sub-threshold mode with the voltage $V_2$. In one embodiment, the pump 206 is a doubling pump, or four times multiplier, or eight times multiplier or greater according to the desired application.

The auxiliary component 208 provides an auxiliary bias voltage $V_b$ to various elements of the pump circuit 104. The auxiliary bias voltage $V_b$ is routed to the terminal 234 of the pump 206, the terminal 221 of the pump 204, and the terminal 212 of the input section 202. The auxiliary voltage $V_b$ is higher than the bias voltage $V_a$. Therefore, the pump 206 operates even more efficiently with the bias voltage $V_b$ than with the bias voltage $V_a$. The pump 204 and input section 202 are configured to cease operation when they receive the voltage $V_b$. Since these components are not needed for operation of the main pump 206, the pump 204 and input section 202 are turned off to conserve power.

The sense component 209 senses the output voltage $V_{out}$ or $V_3$ and provides a feedback (or a FB signal) to the pump 206 via the terminal 236. The FB signal applied to the terminal 236 of the pump 206 allows for output voltage and load regulation by the pump 206.

Figure 5:
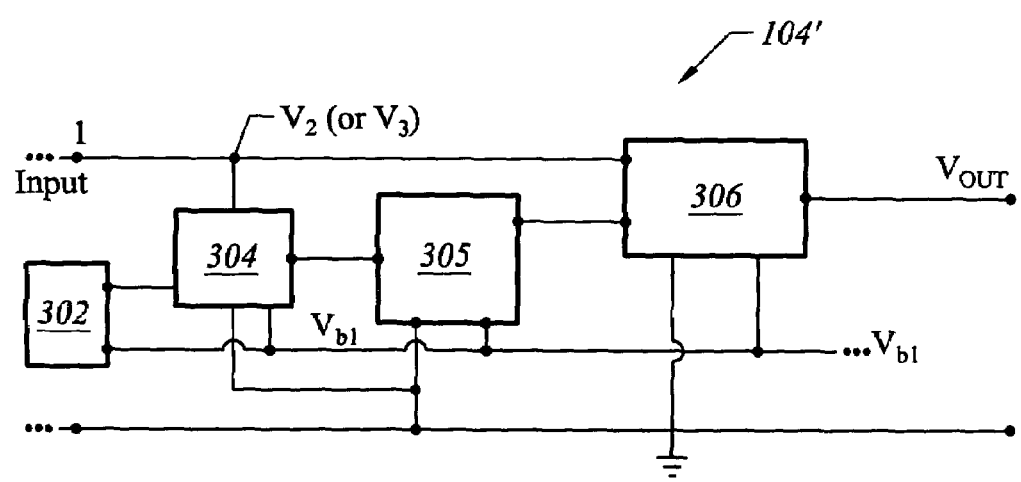
FIG. 5 illustrates a charge pump circuit that may be used in the solar cell system according to one embodiment of the present invention.

FIG. 5 illustrates a charge pump circuit 104' that may be used in the solar cell system 100 according to one embodiment of the present invention. The pump circuit 104' includes an input section 302, a first charge pump 304, a second charge pump 305, and a third charge pump 306. The pump circuit 104' has three or more charge pumps provided in a cascade arrangement to gradually increase the power output. The voltage is output sequentially as the PVSC 102 starts to deliver power. An auxiliary bias voltage $V_{b1}$ obtained from an auxiliary component (not shown) is applied to the charge pumps and the input section to operate the pump circuit 104' more efficiently, as in FIG. 4.

Figure 6:
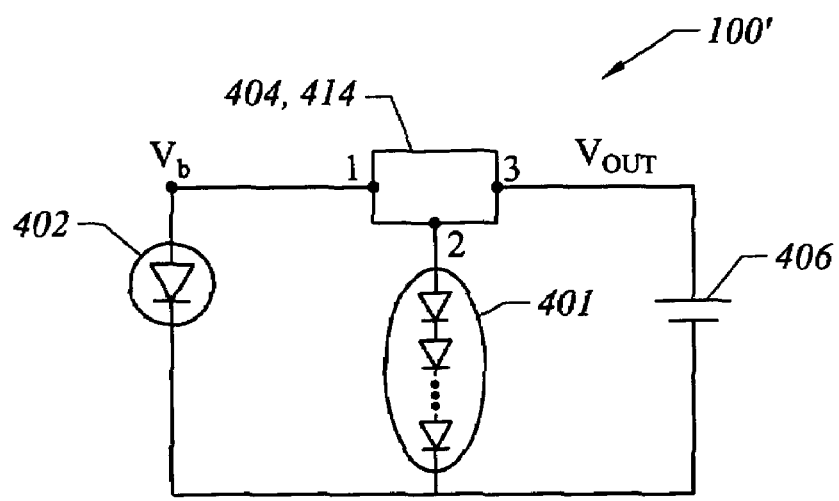
FIG. 6 illustrates a solar cell system having an auxiliary solar cell section 401 according to on embodiment of the present invention.

FIG. 6 illustrates a solar cell system (or a device having a solar cell) 100' having an auxiliary solar cell section 401 according to on embodiment of the present invention. The system 100' also includes a PVSC 402, a pump circuit 404, and a battery 406.

The system 100' uses the auxiliary solar cell section 401 to provide a higher voltage to jump start the pump circuit 404. The system 100 of FIG. 2 requires the use of CMOS building blocks that are designed to operate in sub-threshold conditions. However, these circuit elements generally consume valuable real estate in an IC. The task of designing and fabricating such s circuit is relatively complex if the PVSC uses a single p-n junction that delivers about 0.65 volt from the light.

The PVSC may be provided with a multiple p-n junctions, e.g., two p-n junctions, stacked on top of each other. The resulting voltage would be about 1.3 volt. Even with the 1.3 volt as the input voltage $V_2$, the area consumed by the input section and the first or minor charge pump is relatively high. Furthermore, the use of circuits configured for a sub-threshold mode would likely result in lower yields due to process complexity. Also, sub-threshold CMOS circuit elements are not as efficient as those functioning in a full enhancement CMOS operation. The auxiliary solar cell section (PVA) 401 addresses these concerns.

In one embodiment, the PVA 401 is made from a substrate that has smaller die size than the PVSC 402. The PVA includes one or more solar cells. In one embodiment, the PVA includes a plurality of solar cells in series to provide an increased output voltage. The PVA is formed on a single semiconductor substrate, e.g., SOI substrate, in the present embodiment. Alternatively, the PVA may be formed by wiring a plurality of substrates in series.

The PVA is configured to output 3 volts or more, 4 volts or more, 5 volts or more, 6 volts or more, or 7 volts or more when light shines on it. In one embodiment, the PVA has 4 to 20 solar cells connected in series, preferably about 4-6 solar cells connected in series, or 8-10 solar cells connected in series.

In operation, when light shines on the PVSC 402, it also shines on the PVA 401. The PVA then generates a voltage $V_h$ that is greater than the $V_s$ that is used to power up the main charge pump and increase the voltage $V_b$ to a suitable output voltage $V_{out}$ for charging the battery 406. The PVA 401 simplifies the start up of the charge pump circuit 404 and reduces the required components for the pump circuit 404. In one embodiment, the charge pump circuit 404 only has one charge pump (i.e., the main charge pump) or has no more than two charge pumps.

In addition to the advantages disclosed above, the system 100 or 100' enables elimination of the use of photodetector. A conventional solar cell system is commonly provided with a photodetector 68 configured to detect light when it shines on a typical PV-based charger (FIG. 1B). The photodetector detects light and sends an enable signal to the solar cell system to start converting light to electricity. Therefore, the photodetector consumes energy and adds cost.

The system 100' including the PVA 401 does not require use of a photodetector. The PVA may be used to detect the existence of light as well as to generate electricity using the detected light. Namely the voltage generated by the PVA acts as both a power supply and an enable signal to commence the charge pump circuit operation. Therefore, the PVA 401 is configured to provide a signal to activate the system 100' and provide a high bias voltage as well.

In one embodiment, the system 100' includes a DC-to-DC converter 414 instead of the pump circuit 404. The PVA 401 provides both an enable signal to the DC to DC 414 and a higher bias voltage needed for more efficiently operation of a DC-to-DC converter.

Figure 7:
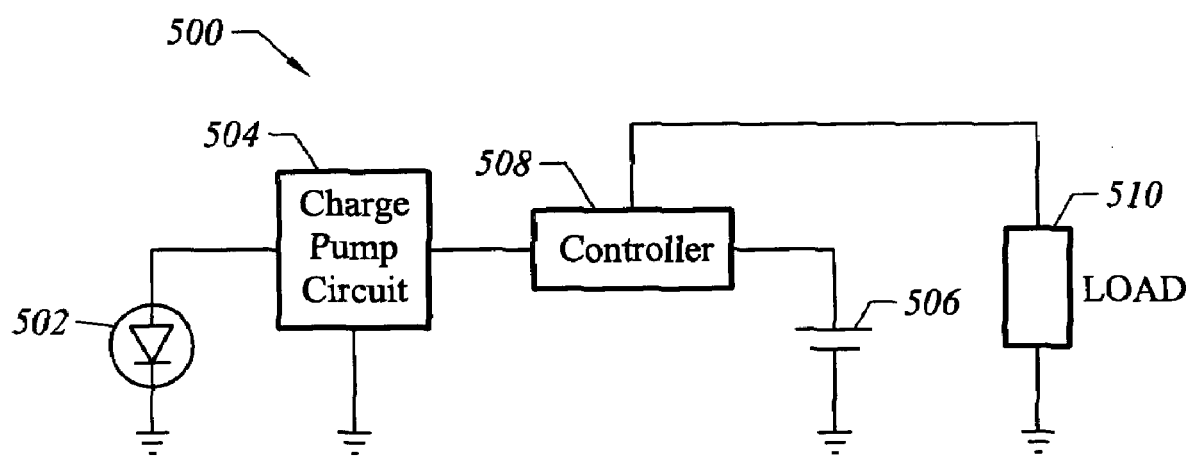
FIG. 7 illustrates an electronic device including a PVSC to provide light energy, a charge pump circuit to increase the voltage received from the PVSC, a battery to store energy, a controller to direct the power output from the pump circuit, and a load.

FIG. 7 illustrates an electronic device 500 including a PVSC 502 to provide light energy, a charge pump circuit 504 to increase the voltage received from the PVSC, a battery to store energy, a controller 508 to direct the power output from the pump circuit, and a load 510. The electronic device may be a personal digital assistant, a wireless Webcam, a mobile phone, a clock, a calculator, and the like. The pump circuit 504 corresponds to the pump circuits of the system 100 and 100'. The controller is configured to direct the power output by the pump circuit 504 to the battery 506 or to the load 510 according to the needs of the load. For example, the controller is configured to direct a portion of the output power to the load and a portion of the output power to the battery while the PVSC 502 is receiving light. However, if the PVSC is not receiving light, the controller directs power stored in the battery 506 to the load.

The present invention has been illustrated using specific embodiments disclosed above. Changes, modification, and alteration may be made to the above embodiments without departing from the scope of the present invention. Accordingly, the scope of the present invention is to be interpreted by the appended claims.

What is claimed is:

1. A solar cell device, comprising:
   a solar cell section configured to output a first voltage upon receiving light;
   a charge pump circuit including a first charge pump and a second charge pump, the first charge pump including a first terminal and a second terminal, the first terminal being configured to receive the first voltage from the solar cell section and the second terminal being configured to output a second voltage that is higher than the first voltage, the second charge pump being configured to receive the second voltage from the second terminal of the first charge pump and output a voltage;
   an auxiliary component coupled to the first and second charge pumps to provide a first bias voltage to the first and second charge pumps, wherein the first bias voltage is higher than the second voltage; and
   an output section configured to receive an output voltage output by the charge pump circuit, wherein the charge pump circuit is configured to be powered by the solar cell section, the charge pump circuit being a low power integrated circuit.

2. The solar cell device of claim 1, wherein the charge pump circuit is not connected to any external power source, and wherein the charge pump circuit is formed on a single semiconductor substrate.

3. The solar cell device of claim 1, wherein the solar cell section is a single solar cell.

4. The solar cell device of claim 3, wherein the solar cell section outputs about 1 volt or less.

5. The solar cell device of claim 1, wherein the solar cell section includes no more than 5 cells in series.

6. The solar cell device of claim 1, further comprising:
a sense component coupled to the second charge pump and an output of the charge pump circuit and configured to provide a feedback signal to the second charge pump.

7. The solar cell device of claim 1, wherein the solar cell section is formed on a single semiconductor substrate.

8. The solar cell device of claim 1. wherein the charge pump circuit is formed on a single semiconductor substrate.

9. The solar cell device of claim 8, wherein the solar cell device and the charge pump circuit are formed in the same semiconductor substrate.

10. The solar cell device of claim 1, further comprising:
an auxiliary solar cell section coupled to the charge pump circuit to provide a second bias voltage to turn on the charge pump circuit, the second bias voltage being higher than the first voltage output by the solar cell section.

11. The solar cell device of claim 10, wherein the auxiliary solar cell section is formed on a single semiconductor substrate.

12. The solar cell device of claim 11, wherein the auxiliary solar cell section includes a plurality of solar cells connected in series.

13. The solar cell device of claim 10, wherein the auxiliary solar cell section is formed on a single semiconductor substrate and includes a plurality of solar cells connected in series.

14. The solar cell device of claim 10, wherein A solar cell device is a portable electronic device configured to be operable using electrical power generated by the solar cell section.

15. The solar cell device of claim 1, wherein the first charge pump ceases operation in response to the first bias voltage received from the auxiliary component.

* * * * *

UNITED STATES PATENT AND TRADEMARK OFFICE
CERTIFICATE OF CORRECTION

| | | |
|---|---|---|
| PATENT NO. | : 7,645,932 B2 | Page 1 of 1 |
| APPLICATION NO. | : 10/936780 | |
| DATED | : January 12, 2010 | |
| INVENTOR(S) | : Ochi et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1079 days.

Signed and Sealed this

Sixteenth Day of November, 2010

David J. Kappos
*Director of the United States Patent and Trademark Office*